US012777722B2

(12) United States Patent
Xiao et al.

(10) Patent No.: US 12,777,722 B2
(45) Date of Patent: Oct. 27, 2026

(54) DISPLAY PANEL WITH POWER LINES

(71) Applicant: SHENZHEN CHINA STAR OPTOELECTRONICS SEMICONDUCTOR DISPLAY TECHNOLOGY CO., LTD., Shenzhen (CN)

(72) Inventors: Pian Xiao, Shenzhen (CN); Linjia Liu, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 407 days.

(21) Appl. No.: 18/384,368

(22) Filed: Oct. 26, 2023

(65) Prior Publication Data

US 2024/0213274 A1 Jun. 27, 2024

(30) Foreign Application Priority Data

Dec. 22, 2022 (CN) ........................ 202211657427.X

(51) Int. Cl.

*H10D 86/60* (2025.01)
*H10D 86/40* (2025.01)
*H10H 20/85* (2025.01)
*H10H 20/857* (2025.01)
*H10W 90/00* (2026.01)

(52) U.S. Cl.

CPC ........... *H10D 86/60* (2025.01); *H10D 86/443* (2025.01); *H10H 20/8506* (2025.01); *H10H 20/857* (2025.01); *H10W 90/00* (2026.01)

(58) Field of Classification Search

CPC .... H10D 86/60; H10D 86/443; H10H 20/857; H10H 20/8506

USPC ........................................................... 257/79

See application file for complete search history.

(56) References Cited

U.S. PATENT DOCUMENTS 12,048,221 B2 * 7/2024 Kim .................... H01L 25/0753
2020/0295243 A1 * 9/2020 Kuo ..................... H10H 20/854
2022/0262854 A1 * 8/2022 Park .................... H01L 25/0753

FOREIGN PATENT DOCUMENTS

KR 20220083430 A * 6/2022 ............... G09F 9/33
WO WO-2022065873 A1 * 3/2022 ............. H10D 86/40

* cited by examiner

*Primary Examiner* — Phuc T Dang

(74) *Attorney, Agent, or Firm* — The Roy Gross Law Firm, LLC; Roy D. Gross

(57) ABSTRACT

The embodiment of the present application provides a display panel. The display panel includes a driver substrate and a light emitting device bonded to and disposed on the driver substrate. The driver substrate includes a driver circuit and a first power line. The first power line includes a conductive pad. The light emitting device includes a first soldering pad and a second soldering pad. The first soldering pad overlaps and is bonded to the conductive pad. The second soldering pad is electrically connected to the driver circuit. The embodiment of the present application overlaps and bonds the opaque first soldering pad to the first power line, particularly overlaps and bonds the first soldering pad to the conductive pad. Therefore, an overlapping area between the first soldering pad and the first power line is increased.

18 Claims, 7 Drawing Sheets

322

DISPLAY PANEL WITH POWER LINES

CROSS REFERENCE TO RELATED APPLICATIONS

This application claims the priority to Chinese Patent Application No. 202211657427.X, filed on Dec. 22, 2022. The entire disclosures of the above application are incorporated herein by reference.

FIELD OF INVENTION

The present application relates to a field of displays, especially to a display panel.

BACKGROUND OF INVENTION

Currently, in the display field, transparent light emitting diode (LED) display panel technology has become a trend. In the transparent LED display panel, the aperture rate of the display region affects the transparency degree of the display panel. To achieve the transparency of the display panel, improving the aperture rate of the transparent display panel is an important optimization direction. Within the transparent display panel, there are both opaque devices and opaque metal wiring structures. How to layout the opaque devices and opaque metal wiring to enhance the aperture rate of the display panel is a critical research issue in the industry.

Therefore, for the transparent display panel, optimization for a layout of opaque devices and opaque metal wirings in the display panel is urgently needed to improve an aperture rate of the transparent display panel.

SUMMARY OF INVENTION

An objective of the present application is to provide a display panel that optimizes a layout of opaque devices and opaque metal wirings in the display panel to improve an aperture rate of the display panel.

To solve the above technical issue, the present application provides a display panel, comprising a driver substrate comprising a driver circuit and a first power line, wherein the first power line comprises a conductive pad; and a light emitting device bonded and disposed on the driver substrate, wherein the light emitting device comprises a first soldering pad and a second soldering pad, the first soldering pad overlaps and is bonded to the conductive pad, and the second soldering pad is electrically connected to the driver circuit.

In some embodiments, the first power line is a cathode power line, the driver substrate further comprises a second power line, and the second power line is an anode power line;

the driver circuit comprises a scan line, a data line, a first thin film transistor, and a second thin film transistor; and a gate electrode of the first thin film transistor is electrically connected to the scan line, a source electrode of the first thin film transistor is electrically connected to the data line, a drain electrode of the first thin film transistor is electrically connected to a gate electrode of the second thin film transistor; a source electrode of the second thin film transistor is electrically connected to the second power line, a drain electrode of the second thin film transistor is electrically connected to the second soldering pad of the light emitting device.

In some embodiments, the first power line is an anode power line, the driver substrate further comprises a second power line, and the second power line is a cathode power line;

the driver circuit further comprises a scan line, a data line, a first thin film transistor, and a second thin film transistor;

a gate electrode of the first thin film transistor is electrically connected to the scan line, a source electrode of the first thin film transistor is electrically connected to the data line, a drain electrode of the first thin film transistor is electrically connected to a gate electrode of the second thin film transistor; a drain electrode of the second thin film transistor is electrically connected to the second power line, a source electrode of the second thin film transistor is electrically connected to the second soldering pad of the light emitting device.

In some embodiments, the first power line intersects the second power line, and the first power line is disposed insulatively from the second power line; and the first power line comprises a first conductive layer and a second conductive layer, the first conductive layer and the second conductive layer are disposed in different layers and are connected to each other, the second power line comprises a third conductive layer, and the third conductive layer and the second conductive layer are disposed in a same layer at an interval.

In some embodiments, the second power line comprises a fourth conductive layer, the fourth conductive layer and the third conductive layer are disposed in different layers and are connected to each other;

the fourth conductive layer and the first conductive layer are disposed in a same layer at an interval; or the fourth conductive layer is located on a side of the third conductive layer away from the first conductive layer.

In some embodiments, the first power line comprises a first line segment and a second line segment connected to each other, the first line segment is disposed to extend along a first direction, and the second line segment is disposed to extend along a second direction intersecting the first direction;

the second power line comprises a third line segment and a fourth line segment connected to each other, the third line segment is disposed to extend along the first direction, the fourth line segment is disposed to extend along the second direction; and the first soldering pad overlaps and is bonded to the first line segment.

In some embodiments, a width of the first line segment is greater than a width of the second line segment.

In some embodiments, the first line segment and the second line segment are disposed in a same layer.

In some embodiments, the display panel further comprises a first driver module and a second driver module, the first driver module and the second driver module are disposed on a same side of the display panel, the first driver module is connected to the data line, and the second driver module is connected to the scan line.

In some embodiments, the scan line comprises a fifth line segment and a sixth line segment connected to each other, the fifth line segment is disposed to extend along a first direction, and the sixth line segment is disposed to extend along a second direction intersecting the first direction; and the data line is disposed to extend along the second direction, and the second driver module is connected to the sixth line segment.

The present application also provides a display panel, comprising a driver substrate comprising a driver circuit and a first power line, wherein the first power line comprises a conductive pad; and a light emitting device bonded and disposed on the driver substrate, wherein the light emitting device comprises a first soldering pad and a second soldering pad, the first soldering pad overlaps and is bonded to the conductive pad, and the second soldering pad is electrically connected to the driver circuit;

wherein the first power line intersects the second power line, and the first power line is disposed insulatively from the second power line; and wherein the first power line comprises a first conductive layer and a second conductive layer, the first conductive layer and the second conductive layer are disposed in different layers and are connected to each other, the second power line comprises a third conductive layer, and the third conductive layer and the second conductive layer are disposed in a same layer at an interval;

wherein the first power line comprises a first line segment and a second line segment connected to each other, the first line segment is disposed to extend along a first direction, and the second line segment is disposed to extend along a second direction intersecting the first direction;

wherein the second power line comprises a third line segment and a fourth line segment connected to each other, the third line segment is disposed to extend along the first direction, the fourth line segment is disposed to extend along the second direction; and wherein the first soldering pad overlaps and is bonded to the first line segment.

In some embodiments, the first power line is a cathode power line, the driver substrate further comprises a second power line, and the second power line is an anode power line;

the driver circuit comprises a scan line, a data line, a first thin film transistor, and a second thin film transistor; and a gate electrode of the first thin film transistor is electrically connected to the scan line, a source electrode of the first thin film transistor is electrically connected to the data line, a drain electrode of the first thin film transistor is electrically connected to a gate electrode of the second thin film transistor; a source electrode of the second thin film transistor is electrically connected to the second power line, a drain electrode of the second thin film transistor is electrically connected to the second soldering pad of the light emitting device.

In some embodiments, the first power line is an anode power line, the driver substrate further comprises a second power line, and the second power line is a cathode power line;

the driver circuit further comprises a scan line, a data line, a first thin film transistor, and a second thin film transistor;

a gate electrode of the first thin film transistor is electrically connected to the scan line, a source electrode of the first thin film transistor is electrically connected to the data line, a drain electrode of the first thin film transistor is electrically connected to a gate electrode of the second thin film transistor; a drain electrode of the second thin film transistor is electrically connected to the second power line, a source electrode of the second thin film transistor is electrically connected to the second soldering pad of the light emitting device.

In some embodiments, the second power line comprises a fourth conductive layer, the fourth conductive layer and the third conductive layer are disposed in different layers and are connected to each other;

the fourth conductive layer and the first conductive layer are disposed in a same layer at an interval; or the fourth conductive layer is located on a side of the third conductive layer away from the first conductive layer.

In some embodiments, a width of the first line segment is greater than a width of the second line segment.

In some embodiments, the first line segment and the second line segment are disposed in a same layer.

In some embodiments, the display panel further comprises a first driver module and a second driver module, the first driver module and the second driver module are disposed on a same side of the display panel, the first driver module is connected to the data line, and the second driver module is connected to the scan line.

In some embodiments, the display panel further comprises a first driver module and a second driver module, the first driver module and the second driver module are disposed on a same side of the display panel, the first driver module is connected to the data line, and the second driver module is connected to the scan line.

In some embodiments, the scan line comprises a fifth line segment and a sixth line segment connected to each other, the fifth line segment is disposed to extend along a first direction, and the sixth line segment is disposed to extend along a second direction intersecting the first direction; and the data line is disposed to extend along the second direction, and the second driver module is connected to the sixth line segment.

The embodiment of the present application provides a display panel. The display panel includes a driver substrate and a light emitting device bonded to and disposed on the driver substrate. The driver substrate includes a driver circuit and a first power line. The first power line includes a conductive pad. The light emitting device includes a first soldering pad and a second soldering pad. The first soldering pad overlaps and is bonded to the conductive pad. The second soldering pad is electrically connected to the driver circuit.

The embodiment of the present application overlaps and bonds the opaque first soldering pad to the first power line, particularly overlaps and bonds the first soldering pad to the conductive pad. Therefore, an overlapping area between the first soldering pad and the first power line is increased, an opaque region in the display panel is decreased to save a layout distribution in the display panel and increase the aperture rate and transparency of the display panel.

DESCRIPTION OF DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may also acquire other figures according to the appended figures without any creative effort.

Figure 1:
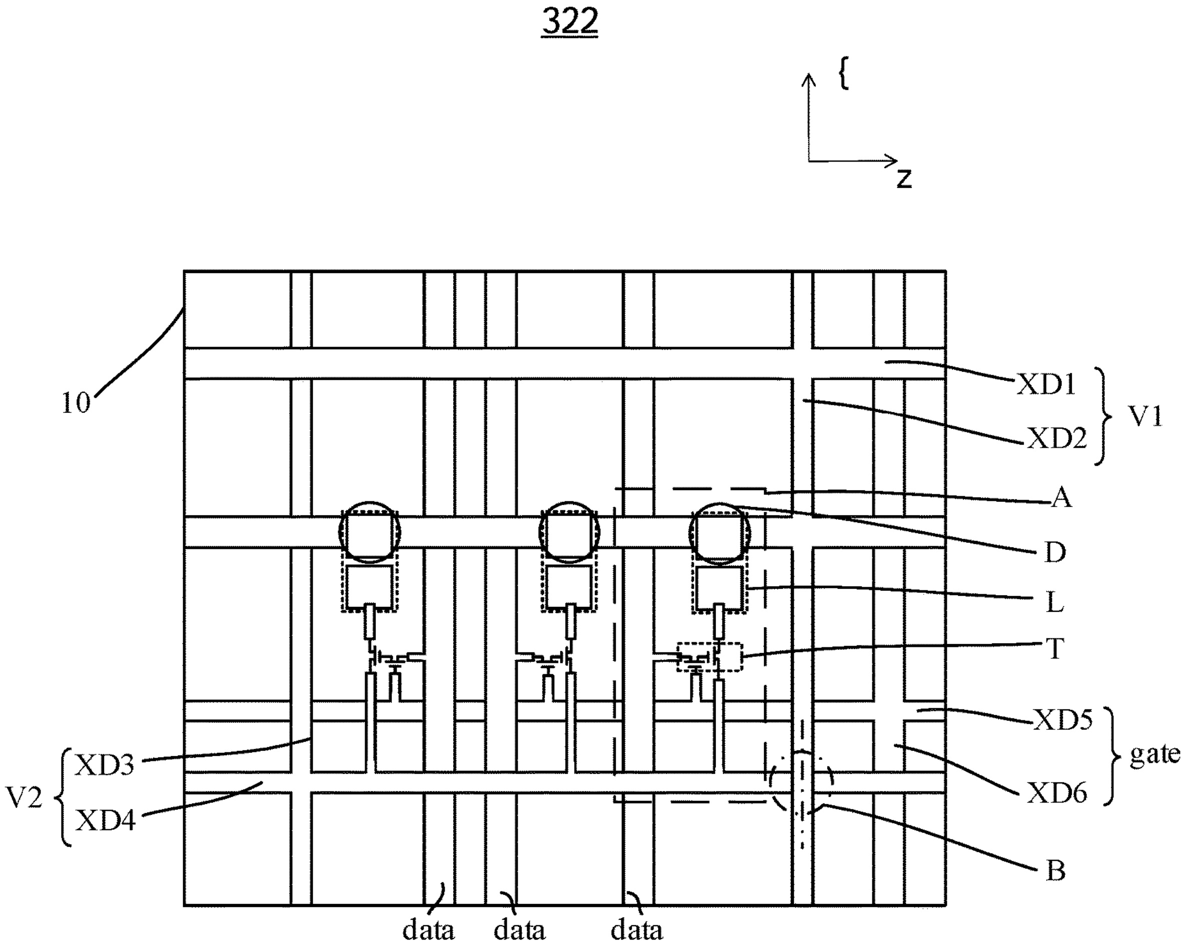
FIG. 1 is a schematic structural view of a display panel provided by a first embodiment of the present application.

Reference characters: 100—display panel; 10—driver substrate; T—driver circuit; T1—first thin film transistor; T2—second thin film transistor; L—light emitting device; L1—first soldering pad; L2—second soldering pad; V1—first power line; V11—first conductive layer; V12—second conductive layer; D—conductive pad; V2—second power line; V21—third conductive layer; V22—fourth conductive layer; I—insulation layer; I1—first insulation layer; I2—second insulation layer; K—via hole; gate—scan line; data—data line; COF1—first driver module; COF2—second driver module; x—first direction; y—second direction; XD1—first line segment; XD2—second line segment; XD3—third line segment; XD4—fourth line segment; XD5—fifth line segment; XD6—sixth line segment; A—partial region; B—intersecting part between the first power line and the second power line.

DETAILED DESCRIPTION OF PREFERRED EMBODIMENTS

The technical solution in the embodiment of the present application will be clearly and completely described below with reference to the accompanying drawings in the embodiments of the present application. Apparently, the described embodiments are merely some embodiments of the present application instead of all embodiments. According to the embodiments in the present application, all other embodiments obtained by those skilled in the art without making any creative effort shall fall within the protection scope of the present application.

It should be explained that in the description of the present application, it should be understood that terminologies of "upper", "lower", "front", "rear", "left", "side", "inner", and "outer" for indicating relations of orientation or position are based on orientation or position of the accompanying drawings, are only for the purposes of facilitating description of the present application and simplifying the description instead of indicating or implying that the referred device or element must have a specific orientation or position, must to be structured and operated with the specific orientation or position. Therefore, they should not be understood as limitations to the present application.

Figure 2:
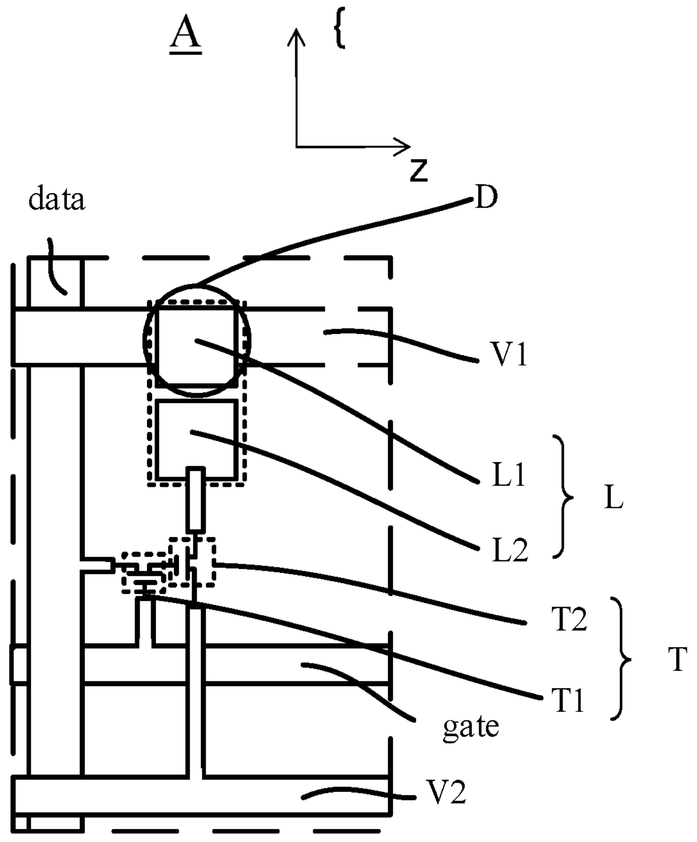
FIG. 2 is a schematic enlarged view of a partial region A of the display panel in FIG. 1.

With reference to FIGS. 1 and 2, a first embodiment of the present application provides a display panel 100, in the first embodiment, the display panel 100 comprises a driver substrate 10 and a light emitting device L bonded to the driver substrate 10. The driver substrate 10 comprises a driver circuit T and a first power line V1. The first power line V1 comprises a conductive pad D, the light emitting device L comprises a first soldering pad L1 and a second soldering pad L2. The first soldering pad L1 overlaps and is bonded to the conductive pad D. The second soldering pad L2 is electrically connected to the driver circuit T.

The embodiment of the present application overlaps and bonds the opaque first soldering pad L1 to the first power line V1, particularly overlaps and bonds the first soldering pad L1 to the conductive pad D. As such, an overlapping area between the first soldering pad L1 and the first power line V1 is increased and an opaque region in the display panel 100 is decreased to save a layout space in the display panel 100, improve a transmittance of the display panel, and increase an aperture rate and a transparency of the display panel 100.

Optionally, the light emitting device L of the present application can be a light emitting diode (LED), mini-light emitting diode (Mini-LED), or micro-light emitting diode (Micro-LED), however the present application has no limit thereto.

Optionally, the conductive pad D can employ a metal element selected from chromium (Cr), copper (Cu), aluminum (Al), silver (Ag), titanium (Ti), iron (Fe), an alloy including any one of the above metal elements, or an alloy of a combination of the above metal elements. In the present embodiment, the conductive pad D is a copper (Cu) sheet. Conductivity of copper is excellent and is easy to melt and bond. During bonding an LED chip, tin is brushed and molten on the conductive pad D, then the LED chip is bonded to the molten part, and the molten part is cooled to form the first soldering pad L1.

In the first embodiment, the first power line V1 is a cathode power line. The driver substrate 10 further comprises a second power line V2, and the second power line V2 is an anode power line.

The driver circuit T comprises a scan line gate, a data line data, a first thin film transistor T1, and a second thin film transistor T2.

A gate electrode of the first thin film transistor T1 is electrically connected to the scan line gate. A source electrode of the first thin film transistor T1 is electrically connected to the data line data. A drain electrode of the first thin film transistor T1 is electrically connected to a gate electrode of the second thin film transistor T2. A source electrode of the second thin film transistor T2 is electrically connected to the second power line V2. A drain electrode of the second thin film transistor T2 is electrically connected to the second soldering pad L2 of the light emitting device L.

It can be understood that the first power line V1 is a cathode power line. As such, the first soldering pad L1 overlaps the cathode power line to increase an overlapping area of the first soldering pad L1 and the cathode power line. Therefore, the opaque region of the display panel 100 is decreased, and the aperture rate and transparency of the display panel 100 is increased. Furthermore, the layout space saved by the first soldering pad L1 overlapping the cathode power line allows more the light emitting devices L disposed in the layout space to improve a pixel density.

It should be explained that the gate electrode of the first thin film transistor T1 is electrically connected to the scan line gate. When the scan line gate is inputted with a high level signal, the first thin film transistor T1 turns on. A signal of the data line data inputted into the source electrode of the first thin film transistor T1 is transmitted to a drain electrode. Because the drain electrode of the first thin film transistor T1 is electrically connected to the gate electrode of the second thin film transistor T2, when the first thin film transistor T1 turns on and the signal of the data line data is a high level signal, the second thin film transistor T2 turns on. The second thin film transistor T2 turns on such that the second soldering pad L2 of the light emitting device L is connected to the anode power line, the first soldering pad L1 is connected to the cathode power line to make the light emitting device L emit light.

Optionally, a metal layer in which the data line data is located and a metal layer in which the scan line gate is located can be disposed insulatively in different layers, and can be disposed in the same layer and insulated from each other at an interval.

Figure 3:
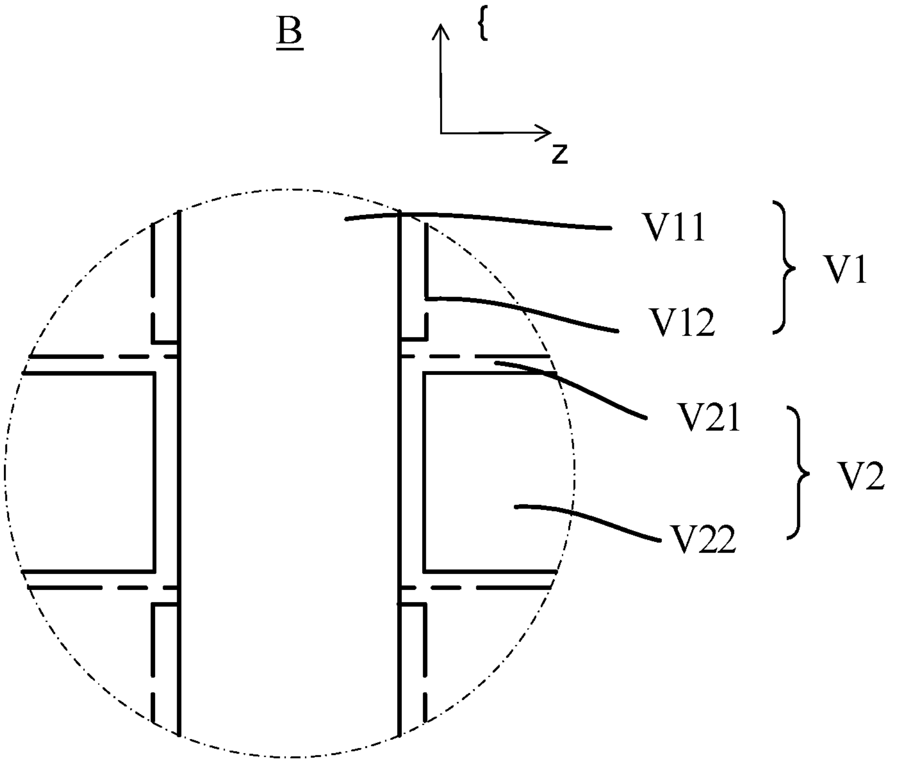
FIG. 3 is a schematic enlarged view of a intersecting part B between a first power line and a second power line display panel of the in FIG. 1.
Figure 4:
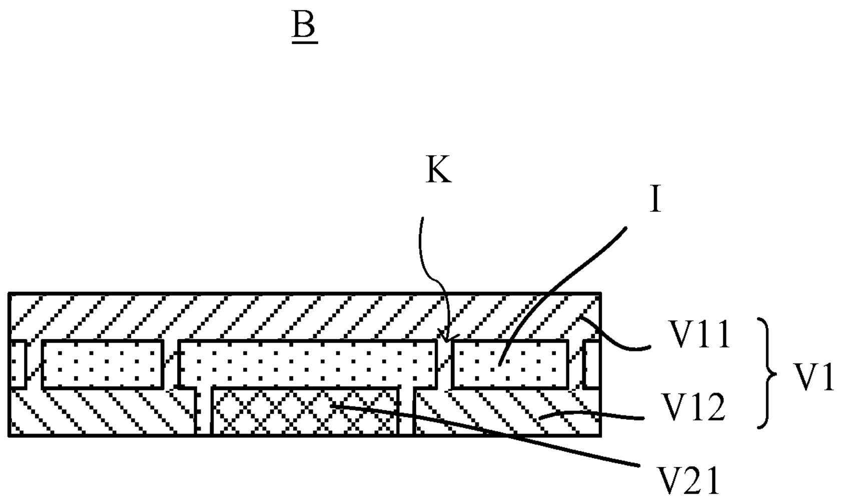
FIG. 4 is a schematic cross-sectional structural view of an intersecting part B between the first power line and the second power line the display panel in FIG. 1 along a second direction.

With reference to FIGS. 3 and 4, in the first embodiment, the first power line V1 intersects the second power line V2. The first power line V1 is disposed insulatively from the second power line V2.

The first power line V1 comprises a first conductive layer V11 and a second conductive layer V12, and the first conductive layer V11 and the second conductive layer V12 are disposed in different layers. The first conductive layer V11 is connected to the second conductive layer V12. The second power line V2 comprises a third conductive layer V21, and the third conductive layer V21 and the second conductive layer V12 are disposed in the same layer at an interval.

It should be explained that for arranging the light emitting device L in the display panel 100, intersecting the first power line V1 and the second power line V2 is required. The second power line V2 and the first power line V1 intersecting each other can make the light emitting device L that overlaps and is bonded to the first power line V1 be connected to the second power line V2.

It can be understood that in the display panel 100, lowering a resistance of the first power line V1 can improve transmission efficiency of the first power line V1 to increase a light emission efficiency of the display panel 100. The first power line V1 the first conductive layer V11 and the second conductive layer V12 connected to and overlapping each other such that while lowering the resistance of the first power line V1, increase of a wiring width of the first power line V1 can be avoided to prevent the wiring width of the first power line V1 from increasing, reduce shielding of the first power wiring to the display panel 100 transparent, and improve the aperture rate. The first power line V1 and the second power line V2 are disposed insulatively from each other such that the third conductive layer V21 and the second conductive layer V12 are disposed in the same layer and are insulatively from each other at an interval. Such configuration can make a smaller thickness of an overlapping part between the second power line V2 and the first power line V1, which facilitates reduction of the film layer thickness.

Optionally, an insulation layer I is further disposed between the first conductive layer V11 and the second conductive layer V12. A via hole K is defined in the insulation layer I. The first conductive layer V11 is connected to the second conductive layer V12 through the via hole K.

In the first embodiment, the second power line V2 can further comprise a fourth conductive layer V22. The fourth conductive layer V22 and the third conductive layer V21 are disposed in different layers and are connected to each other. the fourth conductive layer V22 and the first conductive layer V11 are disposed in the same layer at an interval.

It can be understood that the second power line V2 comprises the third conductive layer V21 and the fourth conductive layer V22 connected to and overlapping each other in different layers, which can lower a resistance of the second power line V2 and avoid increase of the wiring width of the second power line V2, which prevents increase of the second power line V2, reduce shielding of the second power wiring to the display panel 100 transparent, and improve the aperture rate. The first power line V1 and the second power line V2 are disposed insulatively from each other. As such, the fourth conductive layer V22 and the first conductive layer V11 are disposed in the same layer and are insulatively from each other at an interval. Such configuration allows a smaller thickness of an overlapping part between the second power line V2 and the first power line V1, which facilities reduction of the film layer thickness.

In the first embodiment, an insulation layer I is further disposed between the fourth conductive layer V22 and the third conductive layer V21. A via hole K is defined in the insulation layer I. The fourth conductive layer V22 is connected to the third conductive layer V21 through the via hole K.

It can be understood that because the fourth conductive layer V22 and the first conductive layer V11 are disposed in the same layer, the third conductive layer V21 and the second conductive layer V12 are disposed in the same layer. As such, the insulation layer I between the fourth conductive layer V22 and the third conductive layer V21 can be in the same layer with the insulation layer I between the first conductive layer V11 and the second conductive layer V12. Therefore, film layers can be reduced and a thickness of the film layer can be decreased. Disposing the insulation layer I can prevent the first conductive layer V11 from contacting the third conductive layer V21 on the intersecting part between the first power line V1 and the second power line V2, which avoid a shorting circuit due to the first power line V1 contacting the second power line V2.

The embodiment of the present application utilizes the design of multiple stacked conductive layers of the first power line V1 or the second power line V2 to lower the resistance of the first power line V1 or the second power line V2 to prevent increase of the width of the wiring and improve the aperture rate. In the first embodiment, both the first power line V1 and the second power line V2 comprise two conductive layers. Optionally, the first power line V1 can comprise two conductive layers, the second power line V2 comprises a conductive layer. Alternatively, the first power line V1 comprises a conductive layer, and the second power line V2 comprises two conductive layers. Alternatively, the first power line V1 comprises three conductive layers, and the second power line V2 comprises a conductive layer. The present application has no limit thereto.

With reference to FIG. 1 again, in the first embodiment, the first power line V1 comprises a first line segment XD1 and a second line segment XD2 connected to each other. The first line segment XD1 extends along a first direction x. The second line segment XD2 extends along a second direction y intersecting the first direction x.

The second power line V2 comprises a third line segment XD3 and a fourth line segment XD4 connected to each other. The third line segment XD3 extends along the first direction x. The fourth line segment XD4 extends along the second direction y.

The first soldering pad L1 overlaps and is bonded to the first line segment XD1.

It can be understood that the first line segment XD1 of the first power line V1 is configured to overlap and be bonded to the first soldering pad L1 of the light emitting device L such that the light emitting device L is arranged along the first direction x. The second line segment XD2 of the first power line V1 is configured to transmit a power signal. The third line segment XD3 of the second power line V2 extends along the first direction x to be conveniently electrically connected to the light emitting device L arranged along the first direction x. The fourth line segment XD4 of the second power line V2 is configured to transmit a power signal.

In the first embodiment, a width of the first line segment XD1 is greater than a width of the second line segment XD2.

It can be understood that the first soldering pad L1 overlaps and is bonded to the first line segment XD1. A width of the first line segment XD1 is greater than a width of the second line segment XD2, which facilitates bonding of the first soldering pad L1 and the first line segment XD1.

In the first embodiment, the first line segment XD1 and the second line segment XD2 are disposed in the same layer.

It can be understood that the first line segment XD1 and the second line segment XD2 are connected to each other and are disposed in the same layer, which can reduce a film layer thickness and reduce processes. Disposing the first line segment XD1 and the second line segment XD2 can be completed only by one patterning process.

Figure 5:
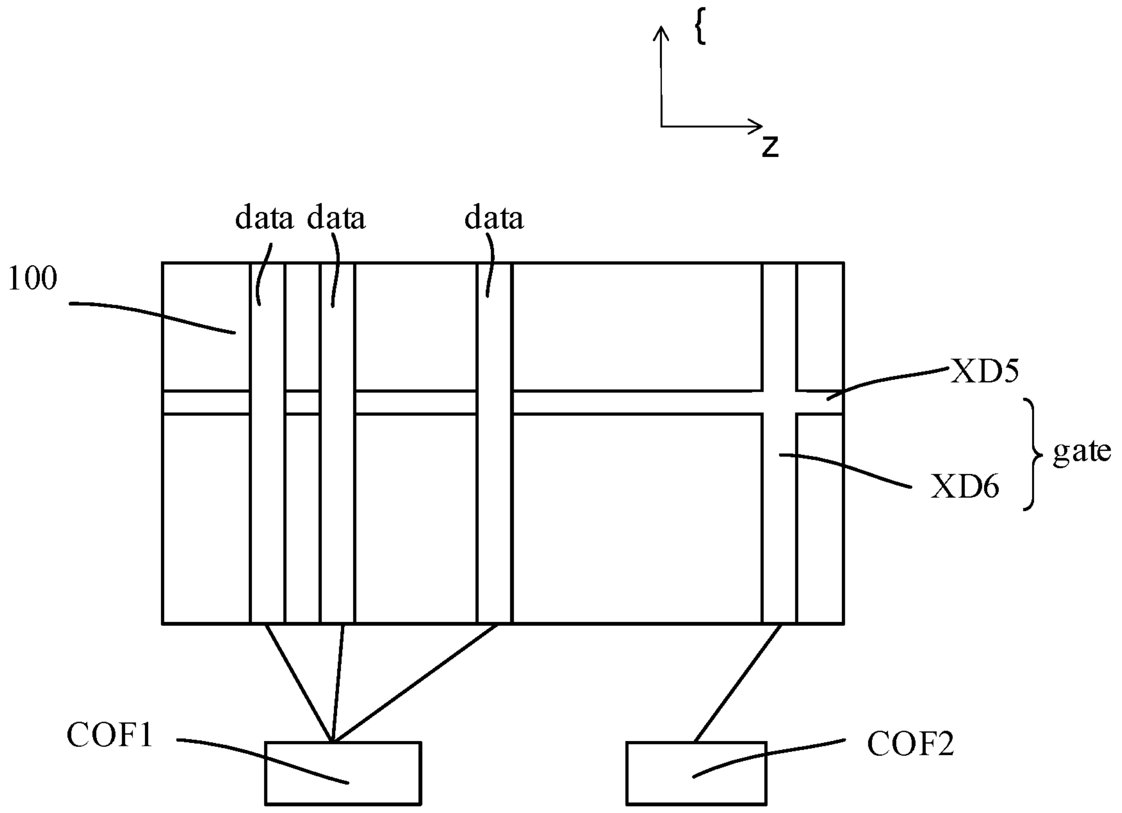
FIG. 5 is a schematic structural view of a data line connected to a first driver module and a scan line connected to a second driver module of the display panel in FIG. 1.

With reference to FIG. 5, in the first embodiment, the display panel 100 further comprises a first driver module COF1 and a second driver module COF2. The first driver module COF1 and the second driver module COF2 are disposed on the same side of the display panel 100. The first driver module COF1 is connected to the data line data, and the second driver module COF2 is connected to the scan line gate.

It can be understood that the first driver module COF1 is configured to output a data signal, the second driver module COF2 is configured to output a scan signal. The first driver module COF1 and the second driver module COF2 are disposed on the same side of the display panel 100 such that another side of the display panel 100 is idle for splicing the display panel 100. The side not for disposing the first driver module COF1 and the second driver module COF2 is used for splicing, which can achieve seamless splicing of the display panel 100.

In the first embodiment, the scan line gate comprises a fifth line segment XD5 and a sixth line segment XD6 connected to each other. The fifth line segment XD5 extends along the first direction x. The sixth line segment XD6 extends along the second direction y intersecting the first direction x.

The data line data extends along the second direction y. The second driver module COF2 is connected to the sixth line segment XD6.

It can be understood that the data line data extends along the second direction y, and the sixth line segment XD6 of the scan line gate also extends along the second direction y. Because the first driver module COF1 and the second driver module COF2 are disposed on the same side of the display panel 100, the data line data and the sixth line segment XD6 extend along the same direction out of the display panel 100, which facilitates connection with the first driver module COF1 and the second driver module COF2 on the same side of the display panel 100.

Figure 6:
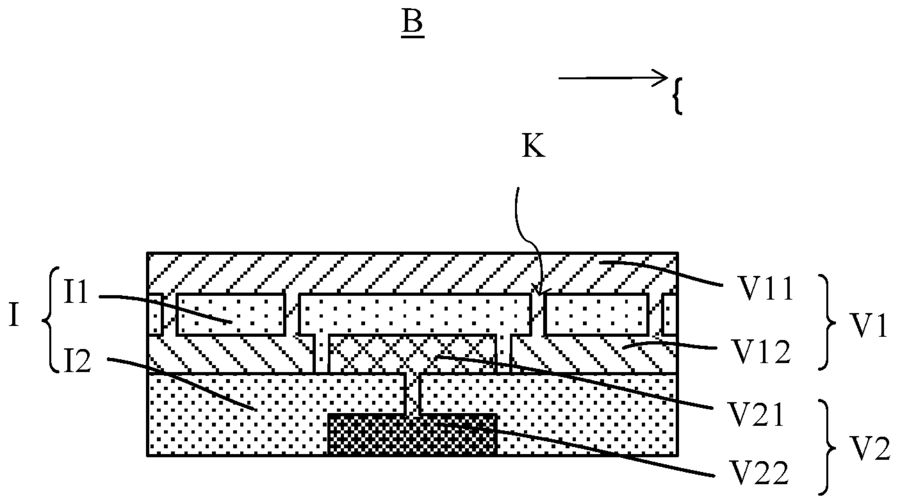
FIG. 6 is a schematic cross-sectional structural view of the intersecting part B between the first power line and the second power line of the display panel provided by a second embodiment of the present application along the second direction.

With reference to FIG. 6, FIG. 6 is a schematic cross-sectional structural view of an intersecting part B between the first power line V1 and the second power line V2 the display panel 100 provided by the second embodiment of the present application along the second direction y. The second embodiment of the present application provides a display panel 100. The second embodiment, compared to the first embodiment, has a difference in that: In the second embodiment, the second power line V2 comprises a fourth conductive layer V22. The fourth conductive layer V22 and the third conductive layer V21 are disposed in different layers and are connected to each other. The fourth conductive layer V22 is located on a side of the third conductive layer V21 away from the first conductive layer V11.

In particular, because the third conductive layer V21 and the second conductive layer V12 are disposed in the same layer at an interval, a first insulation layer I1 is further disposed between the first conductive layer V11 and the third conductive layer V21 to prevent the first conductive layer V11 from contacting the third conductive layer V21 and resulting in connection of the first power line V1 with the second power line V2. The fourth conductive layer V22 is disposed on a side of the third conductive layer V21 away from the first conductive layer V11 to make the fourth conductive layer V22 be connected to the third conductive layer V21. Optionally, a second insulation layer I2 is disposed between the second conductive layer V12 and the fourth conductive layer V22. A via hole K is defined in the second insulation layer I2. The first conductive layer V11 is connected to the second conductive layer V12 through the via hole K.

It can be understood that the second power line V2 comprises a third conductive layer V21 and a fourth conductive layer V22 that are connected to each other and disposed in different layers, which can lower a resistance of the second power line V2 and prevent increasing wiring width of the second power line V2 to prevent the increased wiring width of the second power line V2, reduce shielding of the second power wiring to the display panel 100 transparent, and improve the aperture rate.

Figure 7:
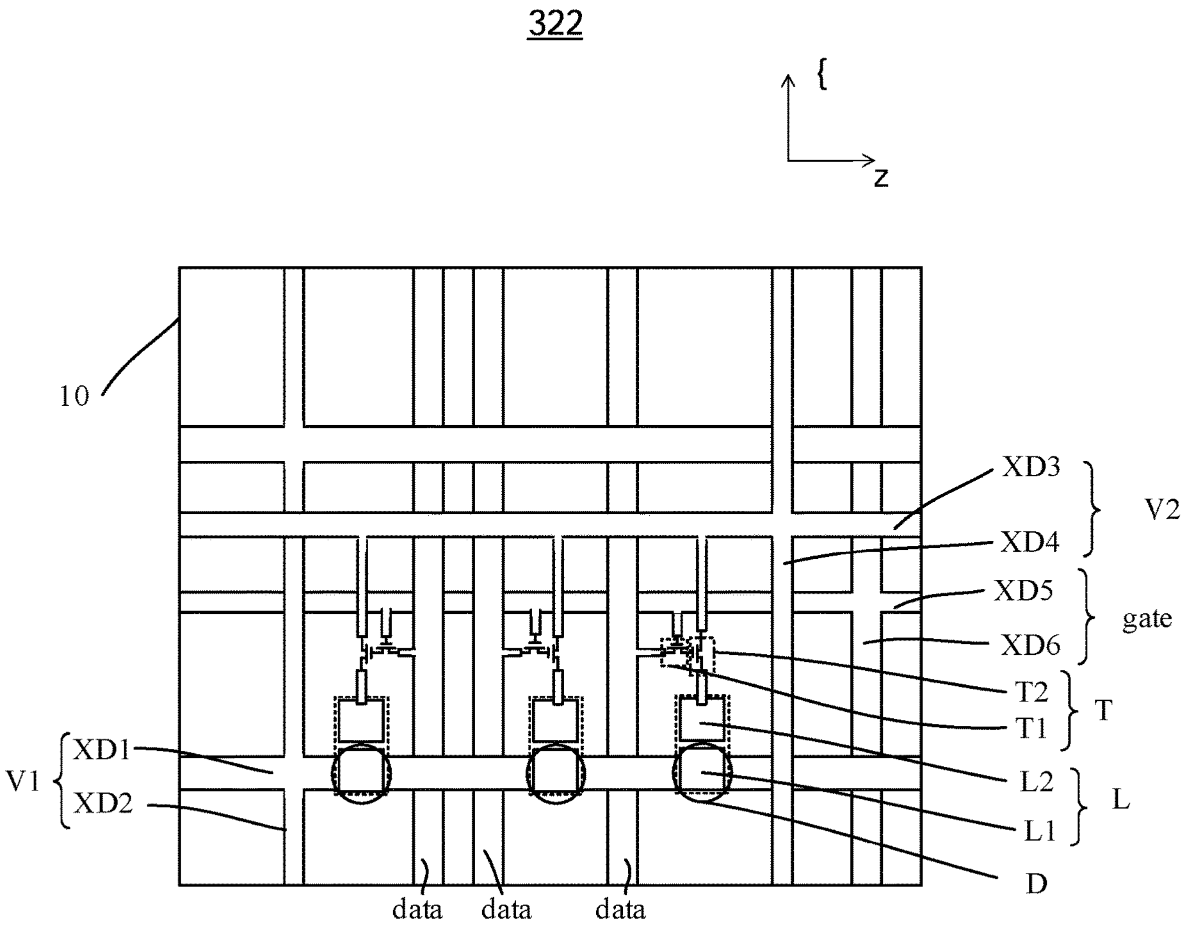
FIG. 7 is a schematic structural view of a display panel of the third embodiment of the present application.

With reference to FIG. 7, FIG. 7 is a schematic structural view of the display panel 100 provided by the third embodiment of the present application. The third embodiment of the present application further provides a display panel 100. The third embodiment, compared to the first or second embodiment, has a difference in that: in the third embodiment, the first power line V1 is an anode power line. The driver substrate 10 further comprises a second power line V2. The second power line V2 is a cathode power line.

The driver circuit T comprises a scan line gate, a data line data, a first thin film transistor T1, and a second thin film transistor T2.

A gate electrode of the first thin film transistor T1 is electrically connected to the scan line gate. A source electrode of the first thin film transistor T1 is electrically connected to the data line data. A drain electrode of the first thin film transistor T1 is electrically connected to a gate electrode of the second thin film transistor T2. A drain electrode of the second thin film transistor T2 is electrically connected to the second power line V2. A source electrode of the second thin film transistor T2 is electrically connected to the second soldering pad L2 of the light emitting device L.

It can be understood that the first power line V1 is an anode power line. As such, the first soldering pad L1 overlaps the anode power line to increase an overlapping area of the first soldering pad L1 and the and the anode power line. Therefore, the opaque region of the display panel 100 is decreased, and the aperture rate and transparency of the display panel 100 is increased. Furthermore, the layout space saved by the first soldering pad L1 overlapping the anode power line allows more of the light emitting devices L disposed in the layout space to improve a pixel density.

It should be explained that the gate electrode of the first thin film transistor T1 is electrically connected to the scan line gate. When the scan line gate is inputted with a high level signal, the first thin film transistor T1 turns on. A signal of the data line data inputted into the source electrode of the first thin film transistor T1 is transmitted to a drain electrode. Because the drain electrode of the first thin film transistor T1 is electrically connected to the gate electrode of the second thin film transistor T2, when the first thin film transistor T1 turns on and the signal of the data line data is a high level signal, the second thin film transistor T2 turns on. The second thin film transistor T2 turns on such that the second soldering pad L2 of the light emitting device L is connected to the cathode power line, the first soldering pad L1 is connected to the anode power line to make the light emitting device L emit light.

The display panel provided by the present application is described in detail as above.

The embodiment of the present application provides a display panel. The display panel includes a driver substrate and a light emitting device bonded to and disposed on the driver substrate. The driver substrate includes a driver circuit and a first power line. The first power line includes a conductive pad. The light emitting device includes a first soldering pad and a second soldering pad. The first soldering pad overlaps and is bonded to the conductive pad. The second soldering pad is electrically connected to the driver circuit.

The embodiment of the present application overlaps and bonds the opaque first soldering pad to the first power line, particularly overlaps and bonds the first soldering pad to the conductive pad. Therefore, an overlapping area between the first soldering pad and the first power line is increased, an opaque region in the display panel is decreased to save a layout distribution in the display panel and increase the aperture rate and transparency of the display panel.

The principles and implementations of the present application are described in the following by using specific examples. The description of the above embodiments is only for assisting understanding of the technical solutions of the present application and the core ideas thereof. Those of ordinary skill in the art should understand that they can still modify the technical solutions described in the foregoing embodiments or equivalently replace some of the technical features. These modifications or replacements do not make the essence of the technical solutions depart from a range of the technical solutions of the embodiments of the present application.

What is claimed is:

1. A display panel, comprising a driver substrate comprising a driver circuit and a first power line, wherein the first power line comprises a conductive pad; and a light emitting device bonded and disposed on the driver substrate, wherein the light emitting device comprises a first soldering pad and a second soldering pad, the first soldering pad overlaps and is bonded to the conductive pad, and the second soldering pad is electrically connected to the driver circuit;

wherein the first power line is an anode power line, the driver substrate further comprises a second power line, and the second power line is a cathode power line;

wherein the driver circuit further comprises a scan line, a data line, a first thin film transistor, and a second thin film transistor;

wherein a gate electrode of the first thin film transistor is electrically connected to the scan line, a source electrode of the first thin film transistor is electrically connected to the data line, a drain electrode of the first thin film transistor is electrically connected to a gate electrode of the second thin film transistor; a drain electrode of the second thin film transistor is electrically connected to the second power line, a source electrode of the second thin film transistor is electrically connected to the second soldering pad of the light emitting device.

2. The display panel according to claim 1, wherein the display panel further comprises a first driver module and a second driver module, the first driver module and the second driver module are disposed on a same side of the display panel, the first driver module is connected to the data line, and the second driver module is connected to the scan line.

3. A display panel, comprising a driver substrate comprising a driver circuit, a first power line, and a second power line, wherein the first power line comprises a conductive pad; and a light emitting device bonded and disposed on the driver substrate, wherein the light emitting device comprises a first soldering pad and a second soldering pad, the first soldering pad overlaps and is bonded to the conductive pad, and the second soldering pad is electrically connected to the driver circuit;

wherein the first power line intersects the second power line, and the first power line is disposed insulatively from the second power line; and wherein the first power line comprises a first conductive layer and a second conductive layer, the first conductive layer and the second conductive layer are disposed in different layers and are connected to each other, the second power line comprises a third conductive layer, and the third conductive layer and the second conductive layer are disposed in a same layer at an interval.

4. The display panel according to claim 3, wherein the second power line comprises a fourth conductive layer, the fourth conductive layer and the third conductive layer are disposed in different layers and are connected to each other;

the fourth conductive layer and the first conductive layer are disposed in a same layer at an interval; or the fourth conductive layer is located on a side of the third conductive layer away from the first conductive layer.

5. The display panel according to claim 4, wherein the first power line comprises a first line segment and a second line segment connected to each other, the first line segment is disposed to extend along a first direction, and the second line segment is disposed to extend along a second direction intersecting the first direction;

the second power line comprises a third line segment and a fourth line segment connected to each other, the third line segment is disposed to extend along the first direction, the fourth line segment is disposed to extend along the second direction; and the first soldering pad overlaps and is bonded to the first line segment.

6. The display panel according to claim 5, wherein a width of the first line segment is greater than a width of the second line segment.

7. The display panel according to claim 5, wherein the first line segment and the second line segment are disposed in a same layer.

8. The display panel according to claim 3, wherein the display panel further comprises a first driver module and a second driver module, the first driver module and the second driver module are disposed on a same side of the display panel, the first driver module is connected to the data line, and the second driver module is connected to the scan line.

9. The display panel according to claim 8, wherein the scan line comprises a fifth line segment and a sixth line segment connected to each other, the fifth line segment is disposed to extend along a first direction, and the sixth line segment is disposed to extend along a second direction intersecting the first direction; and the data line is disposed to extend along the second direction, and the second driver module is connected to the sixth line segment.

10. A display panel, comprising a driver substrate comprising a driver circuit, a first power line, and a second power line, wherein the first power line comprises a conductive pad; and a light emitting device bonded and disposed on the driver substrate, wherein the light emitting device comprises a first soldering pad and a second soldering pad, the first soldering pad overlaps and is bonded to the conductive pad, and the second soldering pad is electrically connected to the driver circuit;

wherein the first power line intersects the second power line, and the first power line is disposed insulatively from the second power line; and wherein the first power line comprises a first conductive layer and a second conductive layer, the first conductive layer and the second conductive layer are disposed in different layers and are connected to each other, the second power line comprises a third conductive layer, and the third conductive layer and the second conductive layer are disposed in a same layer at an interval;

wherein the first power line comprises a first line segment and a second line segment connected to each other, the first line segment is disposed to extend along a first direction, and the second line segment is disposed to extend along a second direction intersecting the first direction;

wherein the second power line comprises a third line segment and a fourth line segment connected to each other, the third line segment is disposed to extend along the first direction, the fourth line segment is disposed to extend along the second direction; and wherein the first soldering pad overlaps and is bonded to the first line segment.

11. The display panel according to claim 10, wherein the first power line is a cathode power line, and the second power line is an anode power line;

the driver circuit comprises a scan line, a data line, a first thin film transistor, and a second thin film transistor; and a gate electrode of the first thin film transistor is electrically connected to the scan line, a source electrode of the first thin film transistor is electrically connected to the data line, a drain electrode of the first thin film transistor is electrically connected to a gate electrode of the second thin film transistor; a source electrode of the second thin film transistor is electrically connected to the second power line, a drain electrode of the second thin film transistor is electrically connected to the second soldering pad of the light emitting device.

12. The display panel according to claim 10, wherein the first power line is an anode power line, the driver substrate further comprises a second power line, and the second power line is a cathode power line;

the driver circuit further comprises a scan line, a data line, a first thin film transistor, and a second thin film transistor;

a gate electrode of the first thin film transistor is electrically connected to the scan line, a source electrode of the first thin film transistor is electrically connected to the data line, a drain electrode of the first thin film transistor is electrically connected to a gate electrode of the second thin film transistor; a drain electrode of the second thin film transistor is electrically connected to the second power line, a source electrode of the second thin film transistor is electrically connected to the second soldering pad of the light emitting device.

13. The display panel according to claim 10, wherein the second power line comprises a fourth conductive layer, the fourth conductive layer and the third conductive layer are disposed in different layers and are connected to each other;

the fourth conductive layer and the first conductive layer are disposed in a same layer at an interval; or the fourth conductive layer is located on a side of the third conductive layer away from the first conductive layer.

14. The display panel according to claim 10, wherein a width of the first line segment is greater than a width of the second line segment.

15. The display panel according to claim 10, wherein the first line segment and the second line segment are disposed in a same layer.

16. The display panel according to claim 11, wherein the display panel further comprises a first driver module and a second driver module, the first driver module and the second driver module are disposed on a same side of the display panel, the first driver module is connected to the data line, and the second driver module is connected to the scan line.

17. The display panel according to claim 12, wherein the display panel further comprises a first driver module and a second driver module, the first driver module and the second driver module are disposed on a same side of the display panel, the first driver module is connected to the data line, and the second driver module is connected to the scan line.

18. The display panel according to claim 16, wherein the scan line comprises a fifth line segment and a sixth line segment connected to each other, the fifth line segment is disposed to extend along a first direction, and the sixth line segment is disposed to extend along a second direction intersecting the first direction; and the data line is disposed to extend along the second direction, and the second driver module is connected to the sixth line segment.

* * * * *